United States Patent
Fan et al.

(10) Patent No.: US 10,630,309 B1
(45) Date of Patent: Apr. 21, 2020

(54) SIGNAL RECEIVER FOR RADIO SIGNAL STRENGTH INDICATION ESTIMATION WITH SUB-SAMPLING ANALOG-TO-DIGITAL CONVERTER FOR RADIO FREQUENCY SIGNAL WITH CONSTANT ENVELOPE MODULATION

(71) Applicant: Uniband Electronic Corp., Hsin-Chu (TW)

(72) Inventors: Yiping Fan, Hsinchu (TW); Li-Feng Chen, New Taipei (TW)

(73) Assignee: Uniband Electronic Corp., Hsin-Chu (TW)

( * ) Notice: Subject to any disclaimer, the term of this patent is extended or adjusted under 35 U.S.C. 154(b) by 0 days.

(21) Appl. No.: 16/387,548

(22) Filed: Apr. 18, 2019

(51) Int. Cl.
| | | |
|---|---|---|
| *H03M 1/00* | (2006.01) | |
| *H03M 1/46* | (2006.01) | |
| *H03M 3/00* | (2006.01) | |
| *H03M 1/10* | (2006.01) | |
| *H03M 1/12* | (2006.01) | |

(52) U.S. Cl.
CPC ........... *H03M 1/46* (2013.01); *H03M 1/1071* (2013.01); *H03M 1/1245* (2013.01); *H03M 3/468* (2013.01)

(58) Field of Classification Search
CPC ..... H03M 1/46; H03M 1/1245; H03M 1/1071
USPC .......................... 341/155, 118, 120, 143, 139
See application file for complete search history.

(56) References Cited

U.S. PATENT DOCUMENTS

| | | | | |
|---|---|---|---|---|
| 2006/0017602 A1* | 1/2006 | Puma | ................... | H03G 1/0088 341/164 |
| 2008/0117087 A1* | 5/2008 | Van Veldhoven | .... | H03M 3/462 341/139 |
| 2014/0117974 A1* | 5/2014 | Chou | ................... | H04B 17/318 324/123 R |
| 2015/0063504 A1* | 3/2015 | Fan | ........................ | H03G 3/001 375/345 |

\* cited by examiner

*Primary Examiner* — Peguy Jean Pierre
(74) *Attorney, Agent, or Firm* — Winston Hsu

(57) ABSTRACT

A signal receiver includes a multiplexer, a sub-sample analog-to-digital converter (ADC) and a received signal strength indicator (RSSI) estimator for a signal receiver with multiple stage cascade amplifiers architecture. The multiplexer may select one of the input signal of each stage of cascade amplifiers or the last stage output signal of cascade amplifiers as a selected signal according to a selection signal. The sub-sample ADC may perform a sub-sampling operation using the selected signal to generate sampled data. The RSSI estimator may calculate a RSSI value corresponding to the selected signal according to the sampled data.

11 Claims, 7 Drawing Sheets

SIGNAL RECEIVER FOR RADIO SIGNAL STRENGTH INDICATION ESTIMATION WITH SUB-SAMPLING ANALOG-TO-DIGITAL CONVERTER FOR RADIO FREQUENCY SIGNAL WITH CONSTANT ENVELOPE MODULATION

BACKGROUND OF THE INVENTION

1. Field of the Invention

The present disclosure relates to a signal receiver and a signal process method, and more particularly, a signal receiver including a sub-sample analog-to-digital converter (ADC) and a received signal strength indicator (RSSI) estimator, and a signal process method thereof.

2. Description of the Prior Art

RSSI (received signal strength indicator) is a key parameter for wireless transceiver. RSSI has a wide application such as Radio Frequency (RF) channel allocation, carrier sensing multiple access, transmitter power control and so on. There are three conventional approaches to estimate RSSI.

The first approach uses RF (radio frequency) rectifier to convert an RF signal to a DC (direct current) level signal which is sampled by an analog-to-digital converter (ADC). This approach suffers low RSSI dynamic range, big estimation variation and high cost. Therefore, it is rarely used in more recent wireless application.

The second approach uses a set of amplifiers. An input signal is either an intermediate frequency (IF) signal or a low intermediate frequency (LIF) signal. The input I/Q (in-phase/quadrature) signals are amplified by a series of cascade amplifiers with the same gain. All inputs and outputs are rectified by full wave rectifiers and the output of all rectifiers are summed together to constitute RSSI, which is further sampled by an ADC. The dynamic range of this RSSI estimation is directly related to the number of the amplifier stages and the RSSI is linearly related to the gains of the amplifiers. Typically, for example, if a 50 dB linear dynamic RSSI is needed and 10 dB gain amplifier is referred, a 4 stage cascade amplifiers can be used and each stage may have a 10 dB gain. Due to one input signal and four amplified signals may be calculated, then five full wave rectifiers, five-input analog adder and high precision ADC are needed. Although this example has 50 dB dynamic range but the hardware cost and power consumption of five full wave rectifiers, five-input analog adder and high precision ADC are the main disadvantage.

The third approach is a more general approach for RSSI estimation and can be applied to both constant envelope and non-constant envelope RF signals. The input signal, either in LIF or in analog baseband, is amplified by the I/Q variable gain amplifiers (VGAs) or programmable gain amplifiers (PGAs). An automatic gain control (AGC) is used to control the VGAs or PGAs so that the input signal level is most suitable for the I/Q ADC. The I/Q ADC is used both for RSSI estimation and further signal processing. Since AGC settling uses a certain amount of time and during which data transmission is impossible, this effect has to be considered when designing a wireless transmission format in order to use the third approach.

Although the abovementioned approaches are used for RSSI estimation, hardware cost such as silicon related cost cannot be saved. The above approaches are difficult to be used with sub-sampling. The dynamic range is also highly limited. Hence, a solution is still required to avoid the shortcomings and disadvantages of the conventional approaches.

SUMMARY OF THE INVENTION

Applying to a constant envelop modulation type signal receiver with cascade amplifiers architecture, an embodiment discloses a signal receiver and a signal process method including a multiplexer, a sub-sample analog-to-digital converter (ADC) and a received signal strength indicator (RSSI) estimator. At the existing N-stage cascade amplifiers architecture, there may be (N−1) intermediate amplified signals and one last stage output. Also, count in the first stage amplifier input signal, there may be (N+1) signal nodes to be referred from the N-stage cascade amplifiers architecture. The multiplexer includes (N+1) terminals and the first input terminal coupled to the input terminal of the first amplifier, a second input terminal coupled to the input terminal of the second amplifier, a third input terminal coupled to the input terminal of the third amplifier, and so on, then $N^{th}$ input terminal coupled to the input terminal of the $N^{th}$ amplifier, and the (N+1) input terminal coupled to the output terminal of the $N^{th}$ (last) amplifier, a select terminal used to receive a selection signal, and an output terminal used to output a selected signal according to the selection signal. The sub-sample ADC is used to perform a sub-sampling operation using the selected signal to generate sampled data. The sub-sample ADC includes an input terminal coupled to the output terminal of the multiplexer and used to receive the selected signal, and an output terminal used to output the sampled data. The RSSI estimator is used to calculate the RSSI value corresponding to the selected signal according to the given sampled data. The RSSI estimator includes an input terminal coupled to the output terminal of the sub-sample ADC and used to receive the sampled data, and an output terminal used to output the RSSI value corresponding to the selected signal according to the sampled data.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
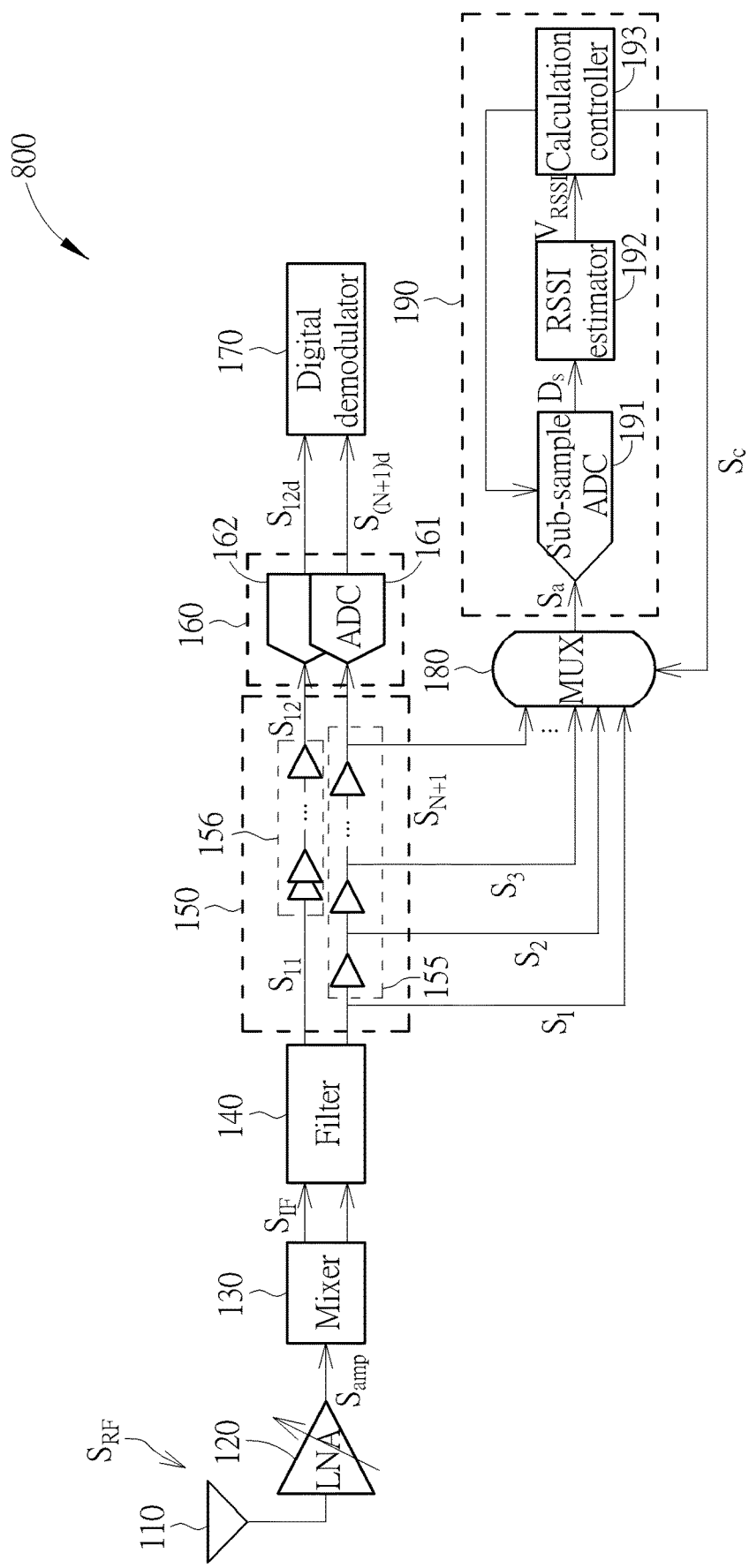
FIG. 1A illustrates an embodiment of proposed signal process method for RSSI calculation and this method can be applying into an N-stage cascade amplifiers signal receiver.

FIG. 1A shows a signal receiver 100 according to an embodiment. As shown in FIG. 1, a proposed signal process method may be performed using a multiplexer 180 and an RSSI (received signal strength indication) calculator 190 for RSSI calculation for the signal receiver 100 with two paths N-stage (N≥1) cascade amplification unit 150 where the amplification unit 150 includes a set of cascade amplifiers 155 and another set of cascade amplifiers 156. The signal receiver 100 used for the proposed signal process method for RSSI calculation may include the N+1 input terminals multiplexer 180, a sub-sample ADC (analog-to-digital converter) 191, an RSSI estimator 192 and a calculation controller 193 for a digital signal receiver 170 with the two paths N-stage cascade amplifiers architecture 150, 155 and 156. The amplification unit 150 may include two paths of cascade amplifiers 155 and 156. These two paths of cascade amplifiers may amplify the in-phase signal and quadrature signal simultaneously where the cascade amplifiers 155 and 156 may be coupled to output terminals of the filter 140 to receive signals $S_1$ and $S_{11}$ to generate two signals $S_{N+1}$ and $S_{12}$. The signal receiver 100 may further include an ADC set 160 including an ADC 161 and an ADC 162 to convert amplified analog in-phase signals to digital in-phase signals and convert amplified analog quadrature signals into digital quadrature signals. Each of the ADC 161 and the ADC 162 may be (but not limited to) a 1-bit ADC. The ADC 161 may be coupled to the cascade amplifier 155 to receive the signal $S_{N+1}$ and be used to convert the signal $S_{N+1}$ to generate a digital signal $S_{(N+1)}d$. The ADC 162 may be coupled to the cascade amplifier 156 to receive the signal $S_{12}$ and be used to convert the signal $S_{12}$ to generate a digital signal $S_{12}d$. The signal receiver 100 may further include a digital demodulator 170 coupled to the ADC set 160 to receive the digital signals $S_{(N+1)}d$ and $S_{12}d$ so as to demodulate the digital signals $S_{(N+1)}d$ and $S_{12}d$. All amplifiers of the amplification unit 150, and the amplifiers 155 and 156 may be LIF (low intermediate frequency) amplifiers and/or IF (intermediate frequency) amplifiers according to an embodiment.

Figure 1B:
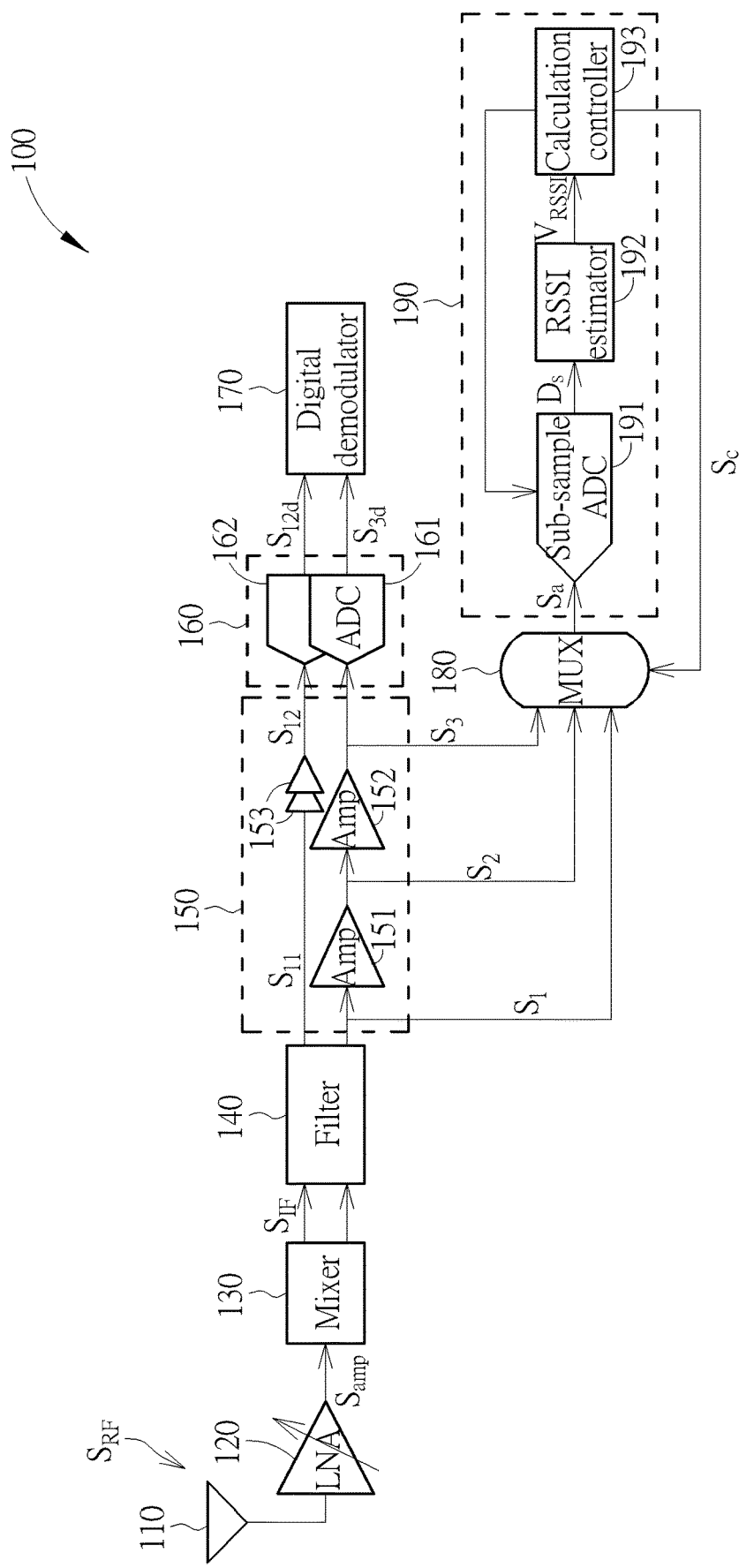
FIG. 1B illustrates an example of proposed signal process method for RSSI calculation applying into a two-stage cascade amplifiers signal receiver.

FIG. 1B illustrates the proposed design for two-stage cascade amplifiers signal receiver (i.e. N=2 in previous section and FIG. 1A) according to an embodiment. The signal receiver 100 may include the amplification unit 150 including two sets of two-stage cascade amplifiers 150 where the first set of two-stage cascade amplifiers may include a first stage amplifier 151 and a second stage amplifier 152, and another set of the two-stage cascade amplifiers may be the set of amplifiers 153. As shown in FIG. 1B, the signal receiver 100 may further include a three input multiplexer 180, a sub-sample analog-to-digital converter (ADC) 191, a received signal strength indicator (RSSI) estimator 192 and a calculation controller 193. In FIG. 1B, regarding an embodiment of two-stage cascade amplifiers, the first amplifier 151 may be used to amplify a first signal $S_1$ to generate a second signal $S_2$. The first amplifier 151 may include an input terminal used to receive the first signal $S_1$, and an output terminal used to output the second signal $S_2$. The second amplifier 152 may be used to amplify the second signal $S_2$ to generate a third signal $S_3$. The second amplifier 152 may include an input terminal coupled to the output terminal of the first amplifier 151 and used to receive the second signal $S_2$, and an output terminal used to output the third signal $S_3$.

The multiplexer 180 in FIG. 1B may include a first input terminal coupled to the input terminal of the first amplifier 151, a second input terminal coupled to the output terminal of the first amplifier 151, a third input terminal coupled to the output terminal of the second amplifier 152, a select terminal used to receive a selection signal $S_c$, and an output terminal used to output a selected signal $S_a$ according to the selection signal $S_c$. The selected signal $S_a$ may be one of the first signal $S_1$, the second signal $S_2$ and the third signal $S_3$ and determined according to the selection signal $S_c$.

The sub-sample ADC 191 may be used to perform a sub-sampling operation using the selected signal $S_a$ to generate sampled data $D_s$. The sub-sample ADC 191 may include an input terminal coupled to the output terminal of the multiplexer 180 and used to receive the selected signal $S_a$, and an output terminal used to output the sampled data $D_s$.

The RSSI estimator 192 may be used to calculate a RSSI value $V_{RSSI}$ corresponding to the selected signal $S_a$ according to the sampled data $D_s$. The RSSI estimator 192 may include an input terminal coupled to the output terminal of the sub-sample ADC 191 and used to receive the sampled data $D_s$, and an output terminal used to output the RSSI value $V_{RSSI}$.

According to different embodiments, the RSSI value $V_{RSSI}$ may be generated by means of one of the following three RSSI estimation calculations.

(1) A digital root mean square (RMS) equation calculation module or a digital simplified RMS equation calculation module may be used for a digitized and amplified IF in-phase signal or a digitized and amplified IF quadrature signal. The RMS result may represent the RSSI value $V_{RSSI}$ corresponding to the RMS value $V_{RMS}$.

(2) A digitized IF in-phase signal or digitized IF quadrature signal may be transferred to be an absolute (ABS) value. Then, a vector of the ABS value may be taken into a mean calculation to represent the RSSI value $V_{RSSI}$ corresponding to the ABS-Mean value $V_{ABsMean}$.

(3) A digitized IF in-phase signal or a digitized IF quadrature signal may be transferred to an ABS value and a corresponding ABS vector may be separated to multiple segments with giving segment size. In each segment, an average of the magnitude first maximum value and the magnitude second maximum value may be calculated as $MagMAX_{AVG}$. After calculating the $MagMAX_{AVG}$ value for giving segments, the $MagMAX_{AVG}$ value of each segment may be used to be the input information of calculation controller 193 or representing the RSSI value $V_{RSSI}$ corresponding to the giving segments.

As shown in FIG. 1B, according to an embodiment, the signal receiver 100 may further include a calculation controller 193. The calculation controller 193 may be an RSSI calculation controller. The calculation controller 193 may be used to generate the selection signal $S_c$ according to the RSSI value $V_{RSSI}$. The calculation controller 193 may include an input terminal coupled to the output terminal of the RSSI estimator 192 and used to receive the RSSI value $V_{RSSI}$, and an output terminal coupled to the select terminal of the multiplexer 180 and used to output the selection signal $S_c$.

According to an embodiment in FIG. 1B, when the RSSI value $V_{RSSI}$ is greater than an upper bound corresponding to a dynamic range of the sub-sample ADC 191, the selection signal $S_c$ may be set as a first value to select the first signal $S_1$ as the selected signal $S_a$. When the RSSI value $V_{RSSI}$ is between the upper bound and a lower bound corresponding to the dynamic range of the sub-sample ADC 191, the selection signal $S_c$ may be set as a second value to keep the selected signal $S_a$ unchanged. When the RSSI value $V_{RSSI}$ is smaller than the lower bound corresponding to the dynamic range of the sub-sample ADC 191, the selection signal $S_c$ may be set as a third value to select the third signal $S_3$ as the selected signal $S_a$. For example, the selection signal $S_c$ may be a 2-bit signal, and the first value to the third value may be (but not limited to) 00, 01 and 10 to select one of the three signals.

As shown in FIG. 1B, according to an embodiment, the signal receiver 100 may further include an antenna 110, a low noise amplifier (LNA) 120, a mixer 130, a filter 140. The antenna 110 may be used to receive a radio frequency signal $S_{RF}$. The low noise amplifier 120 may be used to amplify the radio frequency signal $S_{RF}$ to generate an amplified signal $S_{amp}$. The low noise amplifier 120 may include an input terminal coupled to the antenna 110 and used to receive the radio frequency signal $S_{RF}$, and an output terminal used to output the amplified signal $S_{amp}$. The mixer 130 may be used to down-convert the amplified signal $S_{amp}$ to generate the down-converted signals $S_{IF}$ ($S_{IF\_I}$ and $S_{IF\_Q}$). The mixer 130 may include an input terminal coupled to the output terminal of the low noise amplifier 120, and two output terminals used to output the down-converted in-phase signal $S_{IF\_I}$ and quadrature signal $S_{IF\_Q}$. The filter 140 may be used to filter the down-converted signals $S_{IF\_I}$ and $S_{IF\_Q}$ to generate the two signals $S_1$ and $S_{11}$. Corresponding to the down-converted signals $S_{IF\_I}$ and $S_{IF\_Q}$, the filter 140 may include two input terminals used to receive the down-converted signals $S_{IF\_I}$ and $S_{IF\_Q}$, and two output terminals, the first output terminal is coupled to the input terminal of the first amplifier 151 and used to output the first signal $S_1$ and the other output terminal is coupled to the input terminal of another two-stage cascade amplifier 153 and used to output another signal $S_{11}$.

According to an embodiment, the filter 140 may be a bandpass filter or a polyphase filter. According to an embodiment, the down-converted signal $S_{IF}$ ($S_{IF\_I}$ and $S_{IF\_Q}$) may have an intermediate frequency (IF) $f_{IF}$ or a low intermediate frequency (LIF) $f_{LIF}$.

According to an embodiment, the first amplifier 151, the second amplifier 152, the multiplexer 180, the sub-sample ADC 191 and the RSSI estimator 192 shown in FIG. 1B may be of an in-phase path or a quadrature path. In other words, the first signal $S_1$ processed by the first amplifier 151 may be of an in-phase path or a quadrature path of I/Q modulation.

In a constant envelope RF signal, the magnitude peak of the signal may be constant and its period may vary according to modulation. The RSSI may correspond to the mean power of the signal. Since the relationship between the peak power and the square-root mean power may be square root of 2, the peak power estimation may be equivalent to RSSI estimation. Therefore, an ADC which samples a sinusoid with a sufficient number of samples with one period should be able to estimate the peak. However, this sort of peak estimation with oversampling may come with high cost and high power consumption. Hence, a solution of achieving an equivalent number of cycles for a sinusoid with a lower sampling rate is required, and a sub-sampling approach may be proposed as described in FIG. 2.

Figure 2:
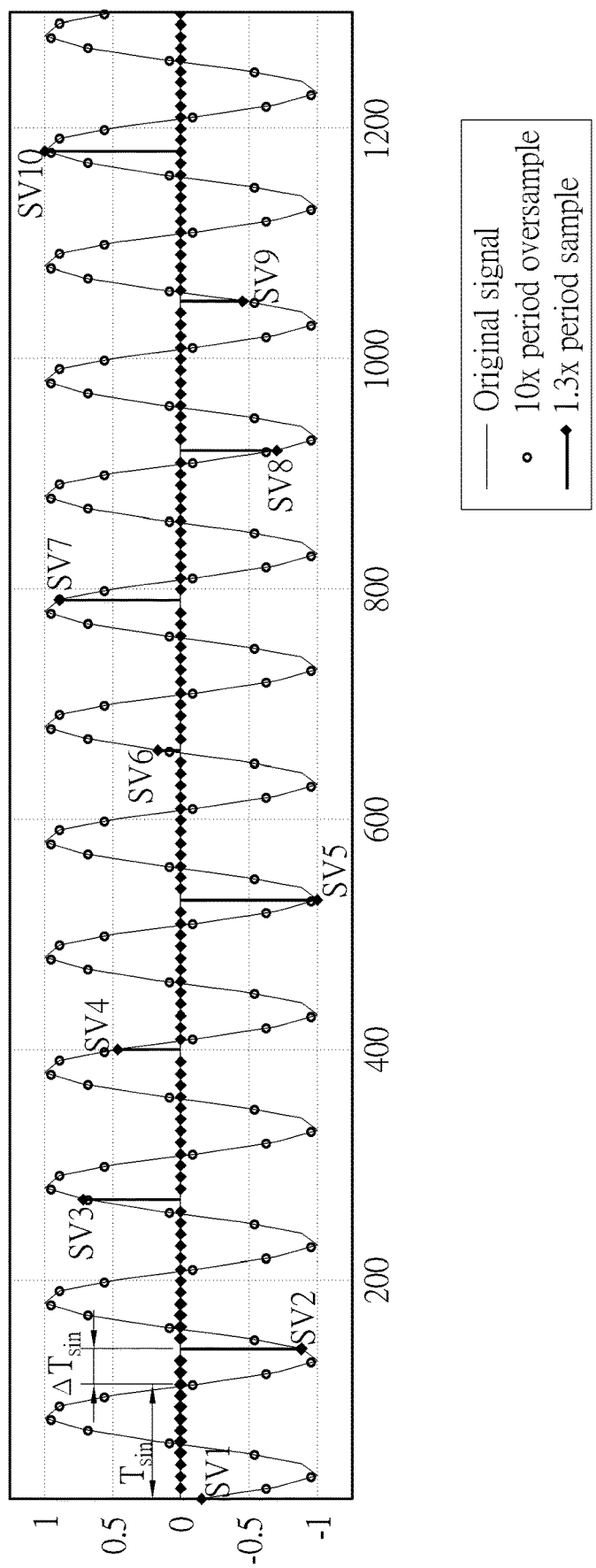
FIG. 2 illustrates a waveform diagram corresponding to the sub-sampling operation performed by the sub-sample ADC of FIG. 1A and FIG. 1B according to an embodiment.

FIG. 2 illustrates a waveform diagram corresponding to the sub-sample ADC 191 performing the sub-sampling operation according to an embodiment. In following equations, eq-1, eq-2, eq-3 express the sub-sampling operation, where n may be a integer larger than one, and the ratio Δ may be a real number between zero and one. Because the sub-sampling period ($T_{sin}+\Delta T_{sin}$) is greater than the signal period $T_{sin}$ of the selected signal $S_a$.

$$T_{sub} = T_{sin} + \Delta T_{sin} \quad \text{(eq-1)}$$

$$f_{sub} = T_{sub}^{-1} \quad \text{(eq-2)}$$

$$r_{sub}[n] = r(t)|_{t=n*T_{sub}} = r(n*T_{sub}) = r(n*(T_{sin} + \Delta T_{sin})) \quad \text{(eq-3)}$$

As expressed by the equation eq-1, the sub-sampling period $T_{sub}$ may be ($T_{sin}+\Delta T_{sin}$), and the sub-sampling frequency $r_{sub}$ may be obtained as expressed by the equation eq-2. The sub-sampling result $r_{sub}$ [n] is corresponding to the "continued" selected signal $S_a$, represented as r (t) at t=n*$T_{sub}$, where n is any integer number.

For example, as shown in FIG. 2, if the ratio Δ is 0.3, the sub-sampling period $T_{sub}$ may be 130% of the signal period $T_{sin}$ of the selected signal $S_a$. In the example of FIG. 2, an eleventh sample value will repeat a first sample value SV1, and a twelfth sample value will repeat a second sample value SV2, and so on. Hence, every ten sample values will repeat the previous ten sample values, and ten sample values (e.g. the first sample value SV1 to a tenth sample values SV10) may be used to reconstruct a period of sine wave as if the sine wave is sampled by a 10 time of signal period. In other words, it may be allowed to use a lower sample frequency (e.g. the sub-sampling frequency $f_{sub}$) to have a similar effect of using a high sample frequency, so the sub-sampling operation may be practiced.

The ratio Δ may be adjusted to adjust the sub-sampling operation. For example, when setting 4=0.01, then 100 equally spaced (i.e. $T_{sub}$) sample values may be used to reconstruct one period of giving periodic signal by 100 times up-sample rate. When setting 4=0.02, then 50 equally spaced (i.e. $T_{sub}$) sample values may be used to reconstruct one period of giving periodic signal by 50 times up-sample rate.

In the example of FIG. 2, since an eleventh sample value may begin to repeat, and ten sample values are enough to estimate the RSSI value $V_{RSSI}$ described in FIG. 1, ten may be used as the variable n.

Figure 3:
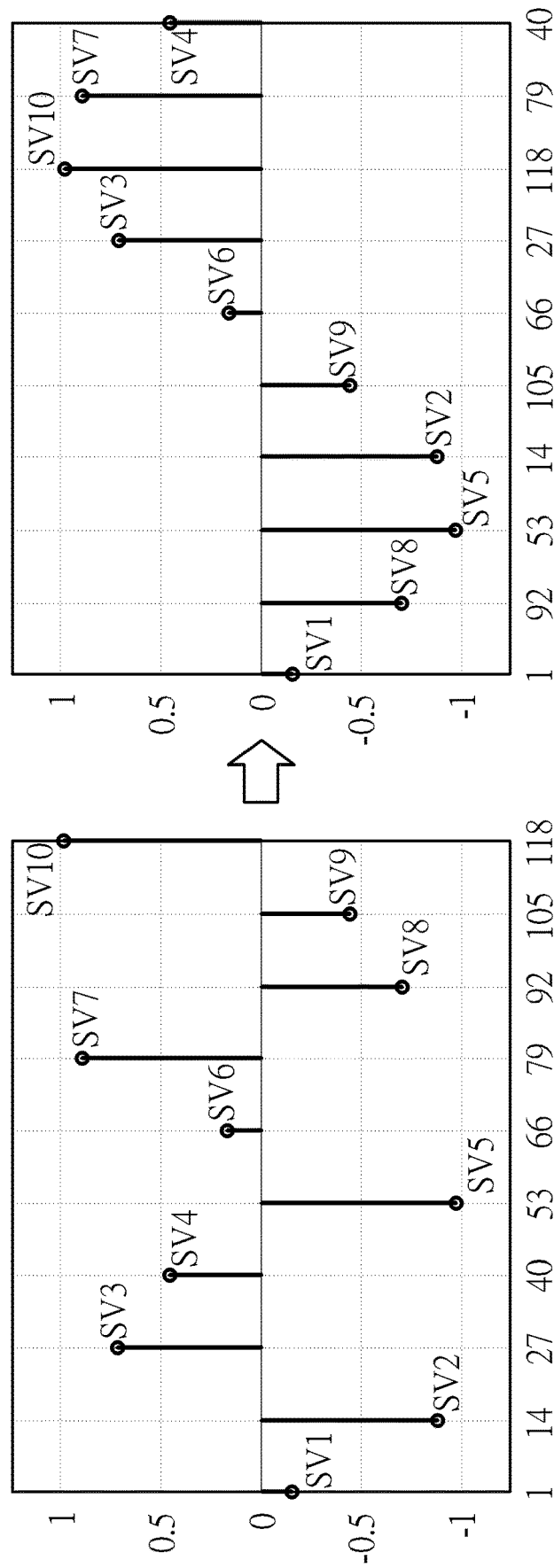
FIG. 3 illustrates that n sample values are reordered according to an embodiment.

FIG. 3 illustrates n sample values are reordered according to an embodiment. As shown in FIG. 2 to FIG. 3, the variable n may be ten. Ten sample values SV1 to SV10 may be obtained, and the ten sample values SV1 to SV10 may be reordered to form a pattern resembling a waveform in the signal period $T_{sin}$ of the selected signal $S_a$. The reordering process shown in FIG. 3 may be used to "reconstruct" a signal being sub-sampled. However, according to an embodiment, the reordering process shown in FIG. 3 may be merely used for better understanding the principle of the disclosure, and the reordering process shown in FIG. 3 may be omitted when an appropriate algorithm is applied to process the sampled data $D_s$.

In FIG. 2 and FIG. 3, for example, the low intermediate frequency (LIF) may be 1.6 MHz (megahertz), an available system clock may be corresponding to a 16 MHz frequency. When an ADC is used and 4=0.3, an equivalent sampling clock may be corresponding to a 16/13 MHz frequency, and each 10 sample values may be taken from 13 periods of this 1.6 MHz sine wave.

Figure 4:
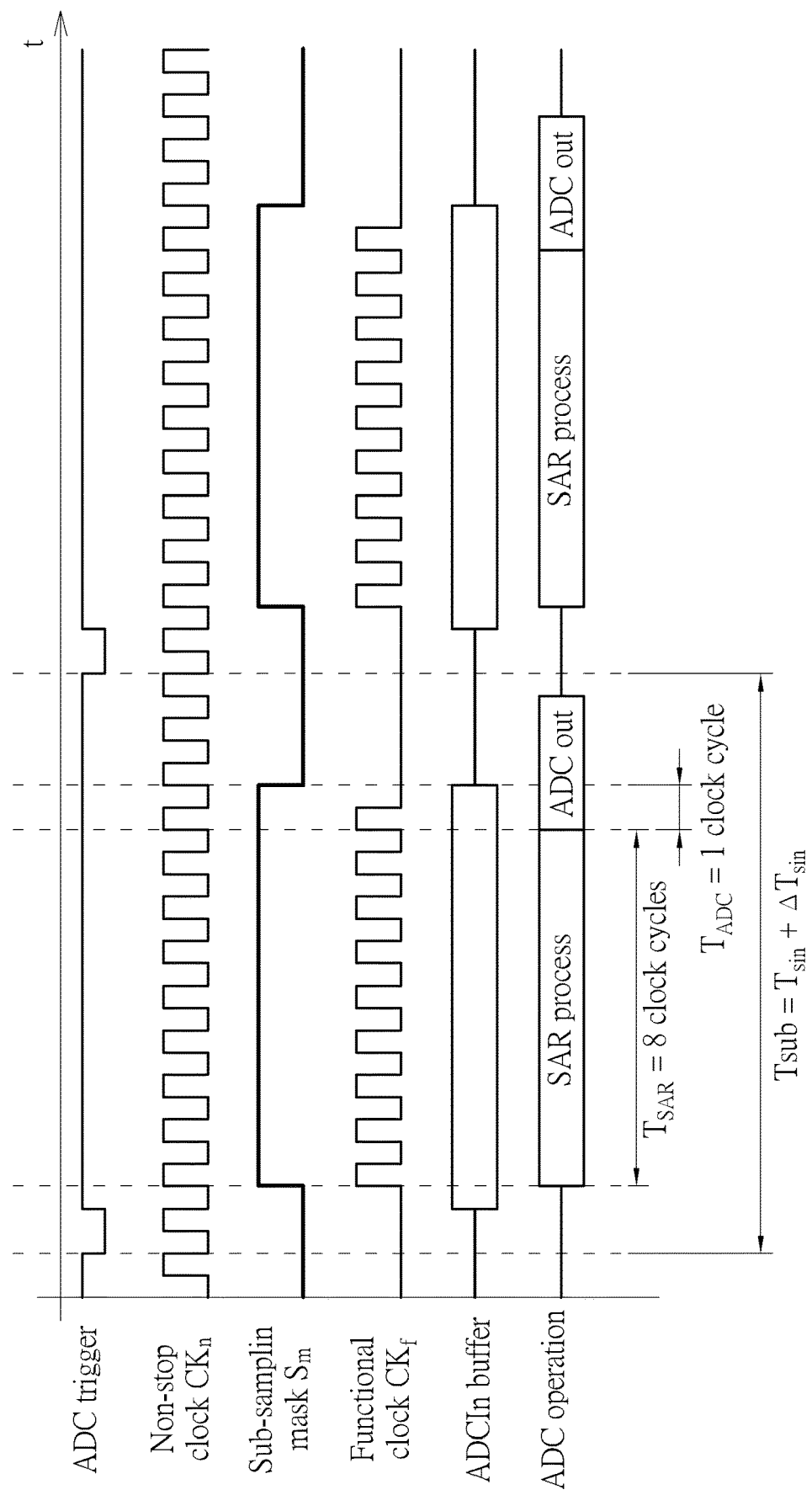
FIG. 4 illustrates a signal timing chart of the sub-sample 8-bit SAR ADC of FIG. 1A and FIG. 1B according to an embodiment.

FIG. 4 illustrates a 8-bit successive approximation register (SAR) ADC timing char example of the sub-sample ADC 191 of FIG. 1 according to an embodiment. The sub-sample ADC 191 may receive a non-stop clock signal $CK_n$ and a sub-sampling mask signal $S_m$ for generating a functional clock signal $CK_f$. The sub-sampling mask signal $S_m$ may be related to a time interval $T_{SAR}$ of the SAR ADC and a time interval $T_{ADC}$ for ADC output. In the example shown in FIG.

4, the time interval $T_{SAR}$ may be 8 clock cycles of the non-stop clock signal CKn, and the time interval $T_{ADC}$ may be at least (but not limited to) one clock cycle. In the example of FIG. 4, the sub-sampling period $T_{sub}$ may include 13 clock cycles. When the used ADC architecture is an 8-bit SAR ADC architecture, there may be at least 9 clock cycles for sub-sampling mask signal $S_m$. There may be 8 clock cycles (iterations) for SAR process and 1 clock cycle for SAR ADC result output latching. The sub-sampling mask signal $S_m$ may be a control signal for masking the non-stop clock $CK_n$ to generate the desired functional clock $CK_f$ which is driving 8-bit SAR ADC once in each the sub-sampling period $T_{sub}$. As shown in FIG. 4, the functional clock $CK_f$ may be corresponding to an ADC operating latency which is equal to $(T_{SAR}+T_{ADC})$ which is a sum of the time interval $T_{SAR}$ and the time interval $T_{ADC}$. FIG. 4 is merely an example for describing an operation of an ADC instead of limiting the scope of embodiments. According to embodiments, for variant types of ADC architectures, the clock behaviors may be different.

Figure 5:
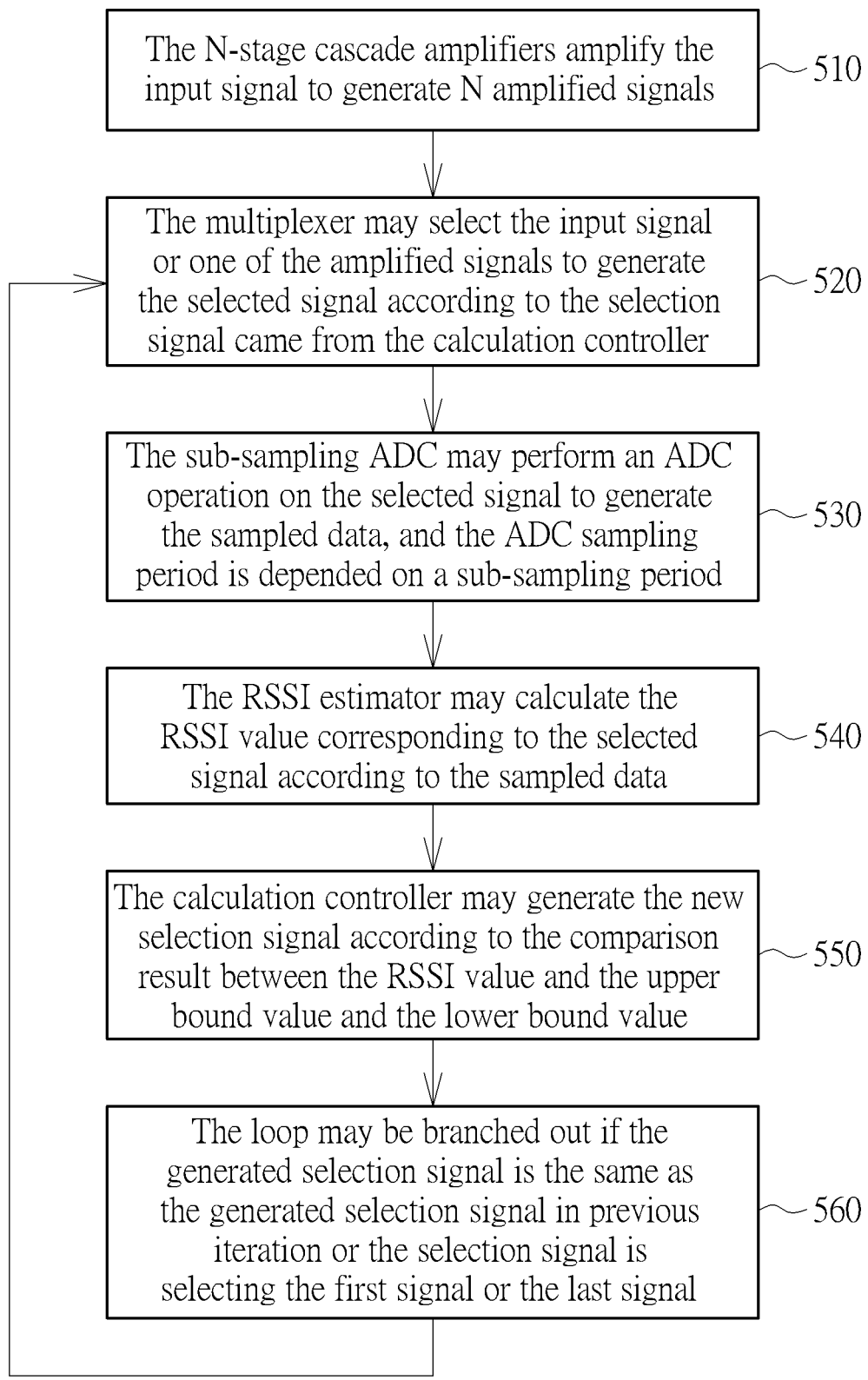
FIG. 5 illustrates a flowchart of a signal process method according to an embodiment.
Figure 6:
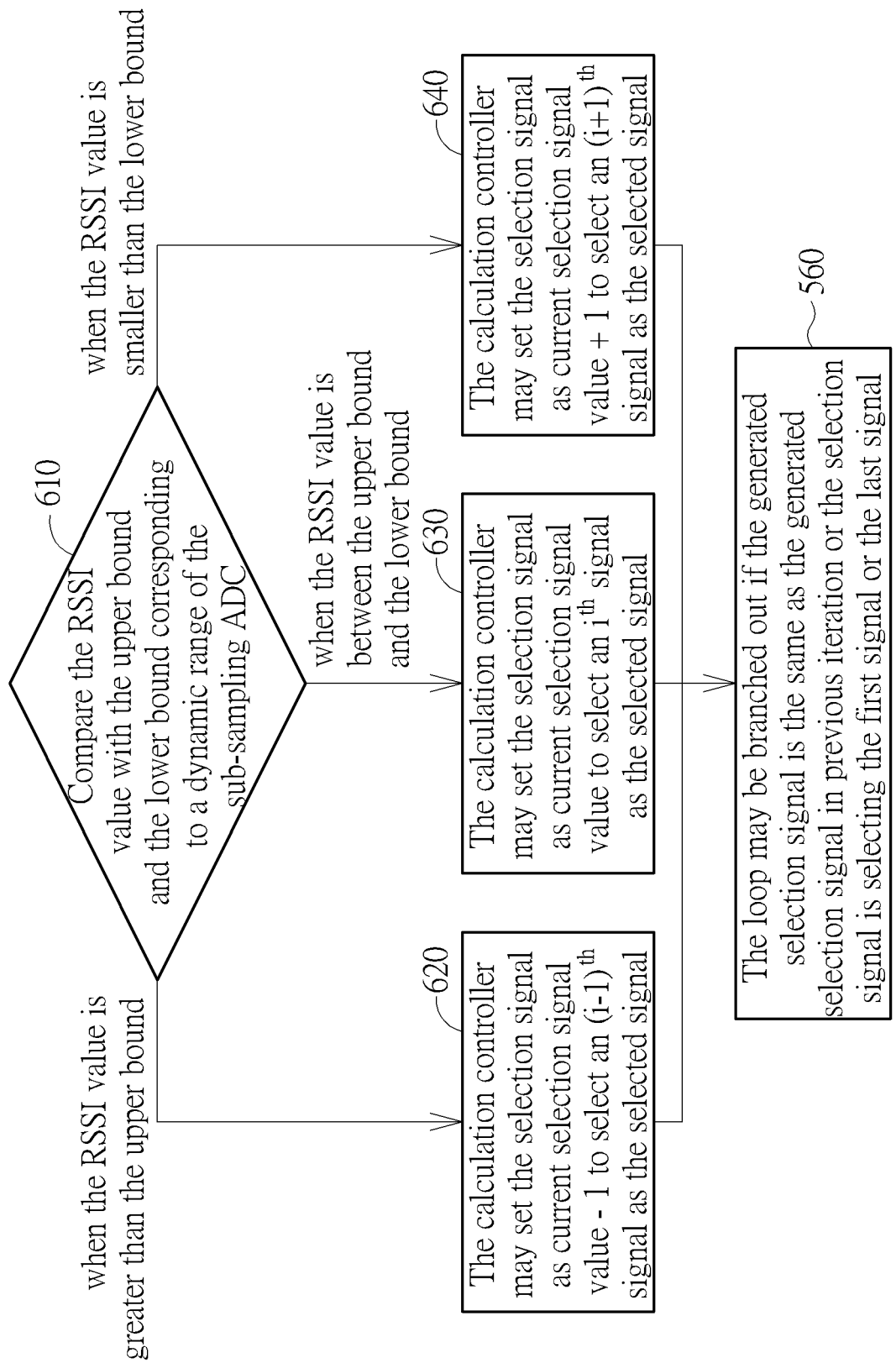
FIG. 6 illustrates a flowchart of step 550 of FIG. 5 about generating the selection signal.

FIG. 5 illustrates a flowchart of a signal process method 500 used by the RSSI calculator 190 in the signal receiver 100 of FIG. 1A and FIG. 1B to calculate the RSSI value $V_{RSSI}$ for RSSI estimation according to an embodiment. FIG. 6 illustrates a flowchart of step 550 of FIG. 5.

The signal process method 500 may include following steps.

Step 510: The N-stage cascade amplifiers amplify the input signal $S_1$ to generate N amplified signals $S_2 \sim S_{N+1}$;

Step 520: The multiplexer may select the input signal $S_1$ or one of the amplified signals $S_2 \sim S_{N+1}$ to generate the selected signal $S_a$ according to the selection signal $S_c$ came from the calculation controller 193 where an initial selected signal $S_a$ may be a signal $S_{floor(N/2)+1}$ if the selection signal $S_c$ is of a value [floor(N/2)+1];

Step 530: The sub-sampling ADC may perform an ADC operation on the selected signal $S_a$ to generate the sampled data $D_s$, and the ADC sampling period is depended on a sub-sampling period $T_{sub}$;

Step 540: The RSSI estimator may calculate the RSSI value $V_{RSSI}$ corresponding to the selected signal $S_a$ according to the sampled data $D_s$;

Step 550: The calculation controller may generate the new selection signal $S_{c(i)}$ according to the comparison result between the RSSI value $V_{RSSI}$ and the upper bound value $Bnd_H$ and the lower bound value $Bnd_L$; and Step 560: The loop may be branched out if the generated selection signal $S_{c(i)}$ is the same as the generated selection signal $S_{c(i+1)}$ in previous iteration or the selection signal $S_{c(i)}$ is selecting the $S_1$ signal or the $S_{N+1}$ signal; otherwise, go to step 520.

In Step 520, the mentioned function floor( ) may be a floor function used to give a largest integer less than or equal to a variable. For example, floor(2.5) is 2, floor(3) is 3, and so on. Hence, the signal $S_{floor(N/2)+1}$ may be a $[floor(N/2)+1]^{th}$ signal of the signal S1 to $S_{N+1}$ sent to the multiplexer 180. In Step 530, the sub-sample ADC 191 may perform the sub-sampling operation by means of the steps of FIG. 2, and it is not repeatedly described. Because the selection signal $S_c$ may be used to select one of the signals $S_1$ to $S_{N+1}$, the selection signal $S_c$ used for selecting an $i^{th}$ signal $S_i$ of the signals $S_1$ to $S_{N+1}$ may be denoted as a selection signal $S_{c(i)}$. Likewise, the selection signal $S_c$ used for selecting an $(i+1)^{th}$ signal $S_{1+i}$ of the signals $S_1$ to $S_{N+1}$ may be denoted as a selection signal $S_{c(i+1)}$ where i is a positive integer, and $1 \le i \le (i+1) \le N$.

When Step 540 is performed for the first time, an initial RSSI value $V_{RSSI}$ may be obtained by calculating the sampled data $D_s$, and the selection signal $S_c$ may be re-generated in Step 550 to update the selection signal $S_c$ and the selected signal $S_a$. Step 550 may include the following steps for the calculation controller 193 to generate the selection signal $S_c$ for the multiplexer 180 to select the selected signal $S_a$.

Step 610: Compare the RSSI value $V_{RSSI}$ with the upper bound $Bnd_H$ and the lower bound $Bnd_L$ corresponding to a dynamic range of the sub-sampling ADC; when the RSSI value $V_{RSSI}$ is greater than the upper bound $Bnd_H$, enter Step 620; when the RSSI value $V_{RSSI}$ is between the upper bound $Bnd_H$ and the lower bound $Bnd_L$, enter Step 630; and when the RSSI value $V_{RSSI}$ is smaller than the lower bound $Bnd_L$, enter Step 640;

Step 620: The calculation controller 193 may set the selection signal $S_c$ as current selection signal value−1 (minus one) to select a signal as the selected signal $S_a$; enter step 560;

Step 630: The calculation controller 193 may set the selection signal $S_c$ as current selection signal value to select a signal $S_i$ as the selected signal $S_a$; enter step 560; and Step 640: The calculation controller 193 may set the selection signal $S_c$ as current selection signal value+1 (plus one) to select a signal $S_{i+1}$ as the selected signal $S_a$; enter step 560.

As described above, for example in FIG. 1B, the first value to the third value may be (but not limited to) "00", "01" and "10" to select one from three signals. By means of the flow described in FIG. 6, the problem of suffering low dynamic range of an ADC may be avoided. For example, before entering Step 610, the selected signal $S_a$ may be an $i^{th}$ signal $S_i$ of the (N+1) signals $S_1$ to $S_{N+1}$ sent to the multiplexer 180 of FIG. 1A. For example, in Step 620, the selection signal $S_c$ may be set as a previous selection value (e.g. 00) to select a previous stage signal $S_{i-1}$ of the signals $S_1$ to $S_{N+1}$ as the selected signal $S_a$. In Step 630, the selection signal $S_c$ may be set as a same value (e.g. 01) to keep the selected signal $S_a$ unchanged as the signal $S_i$. In Step 640, the selection signal $S_c$ may be set as a next selection value (e.g. 10) to select a next stage signal $S_{i+1}$ as the selected signal $S_a$.

For example, according to an embodiment in FIG. 1B, the RSSI estimator 192 may be operated in two rounds to generate the multiplexor selection signal $S_c$ and an equivalent RSSI value $V_{RSSI}$. Since the proposed method 190 may need to switch the receiving gain of input signal $S_a$, the multiplexor 180 selection result, an input signal to the demodulator 170 may not be disturbed. Therefore, the demodulation and wireless package detection may not be interrupted when performing conventional RSSI estimation.

In summary, by means of a signal receiver and a signal process method provided by an embodiment, the RSSI estimation with sub-sampling analog-to-digital conversion can be performed. The dynamic range of an ADC is not as limited as prior art. Hardware cost such as silicon related cost may be saved since the control unit 190 of FIG. 1 and FIG. 8 may be used for sub-sampling and RSSI estimation. The interruption of demodulation and wireless package detection of RSSI estimation can be avoided. RSSI estimation with sub-sampling ADC for RF signal with constant envelop modulation may be performed according to embodiments. Hence, the shortcomings and disadvantages of prior art can be substantially avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal receiver comprising:
a multiplexer comprising (n+1) input terminals, one selection terminal and one output terminal wherein a number (n+1) of the (n+1) input terminals of the multiplexer is depended on a stage count n of cooperating cascade amplifiers, a $k^{th}$ input terminal of the (n+1) input terminals of the multiplexer is coupled to an input terminal of a $k^{th}$ stage of the cooperating cascade amplifiers, and an $(n+1)^{th}$ input terminal of the (n+1) input terminals of the multiplexer is coupled the output terminal of an $n^{th}$ stage of the cooperating cascade amplifiers, the selection terminal of the multiplexer is configured to receive a selection signal, the output terminal is configured to output a selected signal according to the selection signal, n and k are positive integers, and $1 \leq k \leq n$;
a sub-sample analog-to-digital converter (ADC) configured to perform a sub-sampling operation using the selected signal to generate sampled data, the sub-sample ADC comprising an input terminal coupled to the output terminal of the multiplexer and configured to receive the selected signal, and an output terminal configured to output the sampled data; and
a received signal strength indicator (RSSI) estimator configured to calculate a RSSI value corresponding to the selected signal according to the sampled data, the RSSI estimator comprising an input terminal coupled to the output terminal of the sub-sample ADC and configured to receive the sampled data, and an output terminal configured to output the RSSI value; and
a calculation controller configured to generate the selection signal according to the RSSI value, the calculation controller comprising an input terminal coupled to the output terminal of the RSSI estimator and configured to receive the RSSI value, and an output terminal coupled to the selection terminal of the multiplexer and configured to output the selection signal.

2. The signal receiver of claim 1, wherein:
when the RSSI value is greater than an upper bound corresponding to a dynamic range of the sub-sample ADC, the selection signal is set as a previous selection value to select a previous stage signal as the selected signal.

3. The signal receiver of claim 1, wherein:
when the RSSI value is between an upper bound and a lower bound corresponding to a dynamic range of the sub-sample ADC, the selection signal is set as a same value to keep the selected signal unchanged.

4. The signal receiver of claim 1, wherein:
when the RSSI value is smaller than a lower bound corresponding to a dynamic range of the sub-sample ADC, the selection signal is set as a next selection value to select a next stage signal as the selected signal.

5. The signal receiver of claim 1, further comprising:
an antenna configured to receive a radio frequency signal;
a low noise amplifier configured to amplify the radio frequency signal to generate an amplified signal, the low noise amplifier comprising an input terminal coupled to the antenna and configured to receive the radio frequency signal, and an output terminal configured to output the amplified signal;
a mixer configured to down-convert the amplified signal to generate a down-converted signal, the mixer comprising an input terminal coupled to the output terminal of the low noise amplifier, and an output terminal configured to output the down-converted signal; and
a filter configured to filter the down-converted signal to generate the first signal, the filter comprising an input terminal configured to receive the down-converted signal, and an output terminal coupled to the input terminal of the first amplifier and configured to output the first signal.

6. The signal receiver of claim 5, wherein the filter is a bandpass filter or a polyphase filter.

7. The signal receiver of claim 5, wherein the down-converted signal has an intermediate frequency or a low intermediate frequency.

8. A signal receiver comprising:
a multiplexer comprising (n+1) input terminals, one selection terminal and one output terminal wherein a number (n+1) of the (n+1) input terminals of the multiplexer is depended on a stage count n of cooperating cascade amplifiers, a $k^{th}$ input terminal of the (n+1) input terminals of the multiplexer is coupled to an input terminal of a $k^{th}$ stage of the cooperating cascade amplifiers, and an $(n+1)^{th}$ input terminal of the (n+1) input terminals of the multiplexer is coupled the output terminal of an $n^{th}$ stage of the cooperating cascade amplifiers, the selection terminal of the multiplexer is configured to receive a selection signal, the output terminal is configured to output a selected signal according to the selection signal, n and k are positive integers, and $1 \leq k \leq n$;
a sub-sample analog-to-digital converter (ADC) configured to perform a sub-sampling operation using the selected signal to generate sampled data, the sub-sample ADC comprising an input terminal coupled to the output terminal of the multiplexer and configured to receive the selected signal, and an output terminal configured to output the sampled data; and
a received signal strength indicator (RSSI) estimator configured to calculate a RSSI value corresponding to the selected signal according to the sampled data, the RSSI estimator comprising an input terminal coupled to the output terminal of the sub-sample ADC and configured to receive the sampled data, and an output terminal configured to output the RSSI value;
wherein the multiplexer, the sub-sample ADC and the RSSI estimator are of an in-phase path or a quadrature path depended on which set of cascade amplifiers to be used.

9. A signal receiver comprising:
a multiplexer comprising (n+1) input terminals, one selection terminal and one output terminal wherein a number (n+1) of the (n+1) input terminals of the multiplexer is depended on a stage count n of cooperating cascade amplifiers, a $k^{th}$ input terminal of the (n+1) input terminals of the multiplexer is coupled to an input terminal of a $k^{th}$ stage of the cooperating cascade amplifiers, and an $(n+1)^{th}$ input terminal of the (n+1) input terminals of the multiplexer is coupled the output terminal of an $n^{th}$ stage of the cooperating cascade amplifiers, the selection terminal of the multiplexer is configured to receive a selection signal, the output terminal is configured to output a selected signal according to the selection signal, n and k are positive integers, and $1 \leq k \leq n$;
a sub-sample analog-to-digital converter (ADC) configured to perform a sub-sampling operation using the selected signal to generate sampled data, the sub-sample ADC comprising an input terminal coupled to the output terminal of the multiplexer and configured to receive the selected signal, and an output terminal configured to output the sampled data; and a received signal strength indicator (RSSI) estimator configured to calculate a RSSI value corresponding to the selected signal according to the sampled data, the RSSI estimator comprising an input terminal coupled to the output terminal of the sub-sample ADC and configured to receive the sampled data, and an output terminal configured to output the RSSI value;

wherein the sub-sample ADC performs the sub-sampling operation using the selected signal to generate the sampled data by:

obtaining a signal period of the selected signal;

multiplying the signal period by a ratio to generate a delay time;

adding the signal period and the delay time to generate a sub-sampling period; and sampling the selected signal with the sub-sampling period to obtain sub-sampled results;

wherein the ratio is a real number between zero and one.

10. The signal receiver of claim 9, wherein the sub-sampled values are reordered according to form a pattern resembling a waveform in the signal period of the selected signal.

11. The signal process method of claim 9, wherein the sub-sample ADC is configured to receive a non-stop clock signal and a sub-sampling mask signal for generating a functional clock signal corresponding to an ADC operating latency.

\* \* \* \* \*